United States Patent
Yamamoto (10) Patent No.: US 6,335,655 B1
(45) Date of Patent: *Jan. 1, 2002

(54) FILTER CIRCUIT

(75) Inventor: Takeshi Yamamoto, Yokohama (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/991,403

(22) Filed: Dec. 16, 1997

(30) Foreign Application Priority Data

Dec. 16, 1996 (JP) .......................... P8-335636

(51) Int. Cl.$^7$ ................................ H03K 5/00
(52) U.S. Cl. .................. 327/552; 327/562; 327/103; 330/109; 330/258
(58) Field of Search ............... 327/103, 552, 327/553, 562, 563; 330/258, 303, 107, 109, 252

(56) References Cited

U.S. PATENT DOCUMENTS 5,345,190 A * 9/1994 Kyalor ....................... 330/258
5,528,179 A * 6/1996 Siniscalchi et al. .......... 327/103
5,594,383 A * 1/1997 Tamba ........................ 327/563
5,625,317 A * 4/1997 Deveirman .................. 327/553

OTHER PUBLICATIONS

Rezzi et al: "A 3 V 12–55 MHz BiCMOS Pseudo–Differential Continuous–Time Filter", IEEE Transactions on Circuit and Systems, 1: Fundamental Theory and Applications, vol. 42, No. 11, Nov.–1995 pp. 896–903.

Steyaert, M. et al., "A 10.7MHZ CMOS OTA–R–C BANDPASS FILTER WITH 68DB DYNAMIC RANGE AND ON–CHIP AUTOMATIC TUNING", IEEE International Solid State Circuits Conference, US, IEEE INC., New York, vol. 35, Feb. 1, 1992, pp. 66–67 and 245.

* cited by examiner

Primary Examiner—Dinh T. Le
(74) Attorney, Agent, or Firm—Pillsbury Winthrop

(57) ABSTRACT

A fully differential circuit in which all inputs and outputs of transconductors Gm1+, Gm1−, Gm2+, Gm2− and fixed gain amplifier GA are fully differential signals. The number of feedback loop elements is made odd by the addition of a fixed gain amplifier with a gain of 1 which is not used in conventional filter architecture, each element of the configuration consequently inverts the common voltage, and since the feedback loop has negative feedback with respect to the common voltage, the operating point can be determined without a need for a dedicated DC feedback circuit.

16 Claims, 3 Drawing Sheets

M1 M2 : k1, Vth1

FIG.3

M1 M2 : k1, Vth1
M3 M4 : k2, Vth2

$K = \sqrt{(k1/k2)}$

FILTER CIRCUIT

BACKGROUND OF THE INVENTION

1. Field of the Invention

The present invention relates to a filter circuit used as a basic circuit when processing analog signals in a MOS integrated circuit (IC).

2. Description of the Related Arts

In recent years, due to the increase in digital devices and advances in digital signal processing technology, CMOS integrators applied for digital signal processing account for a large portion of the semiconductor market.

However, since video and audio signals have analog input/output, they can be more easily processed by analog processing. Even when video and audio signals are digitally processed, analog circuits are required for A/D and D/A conversion and filtering carried out before or after conversion and in a clock-generating oscillator and such like. Conventionally, bipolar technology has been regarded as suitable for analog circuits, whereas CMOS technology is regarded as unsuitable except for some circuits such as analog switches, sample holders or such like.

However, bipolar and BiCMOS processing are rather expensive, and in view of the strong demand for a 1-chip CMOS structure achieved by digital/analog consolidation, there has been an increase in development of circuits for processing analog signals with CMOS circuitry.

Analog signal processing features an important function known as an "active filter" which has a high frequency of use and exerts considerable influence on total performance. Conventionally, discrete-time processing filters such as switched capacity filters (SCF) or sample data filters have been the main active filters used in CMOS analog technology. While these filters have the advantage of high precision, since frequencies are fixed precisely according to a clock, and have low sensitivity to capacitor variations originating during manufacturing, these filters have the following disadvantages:

1. continuous-time filters are required before and after due to the existence of "aliasing";
2. since a frequency band several times greater than frequency used for operational amplifier and sample-and-hold (S/H) circuit is required, the filter cannot be used for frequencies higher than the video band.
3. circuit scale is large and therefore not economical. Therefore, it is not possible to produce a simple and inexpensive filter which can be used at high frequencies. This problem cannot easily be resolved since it derives directly from the fact that the filter is a discrete-time filter. Recently, attempts are under way to develop a high-performance continuous-time CMOS filter. The most popular continuous-time filter is a "biquad circuit", consisting of two integrators each comprising a transconductor (Gm) circuit and a capacitor, in which a second-order filter is multistage-connected in order to obtain desired filtering properties. In a bipolar technology, transconductor (voltage-current conversion characteristic) is linearized its characteristic using a resistor and a "gain cell structure of transistors". However, when the above method is used in CMOS, since element Gm (transconductance) is small, many elements of enormous size are required, which is extremely uneconomical. Transconductance properties are therefore obtained by performing voltage-to-current conversion using a differential pair-transistor direct-coupled to the source.

However, in a MOS transistor, gate-source voltage versus drain current is a square relationship and the integration property of capacitor current versus voltage is linear, a single output of the integrator has second-order distortion. It is therefore necessary to cancel second-order distortion using a fully differential input and output signals. In such fully differential processing, since the output DC voltage cannot usually be determined, a bias circuit must be added to determine the DC operating point. Generally, therefore, output DC voltage is detected and DC feedback technique is applied to the bias of the transconductor input. This method is called DC feedback (or common-mode feedback or such like).

Figure 6:
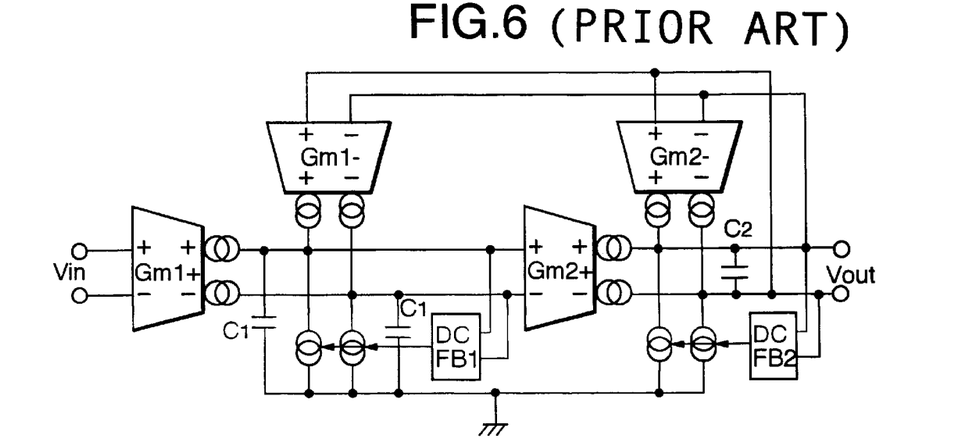
FIG. 6 is a diagram depicting a circuit configuration explaining a conventional second-order biquad.

FIG. 6 shows a conventional example of this type of fully differential biquadratic circuit provided with DC feedback. This circuit is made up of integrators in two stages, each stage consisting of two transconductors sharing a common output terminal and a capacitor connected to said output terminal. Lower transconductors Gm1+ and Gm2+ correspond to + input in a single configuration; upper transconductors Gm1- and Gm2- correspond to - input (feedback input) in a single configuration.

Two-stage integrators are cascade-connected as above to form a low-pass filter or such like. The output DC voltage is controlled to a predetermined voltage by monitoring the output of DC feedbacks 1 and 2 at each integrator and controlling the bias current of the output terminal in each stage. In addition to an LPF, other filter types such as BPF and HPF can be created by modifying the signal input position and output signal extraction position.

Figure 7:
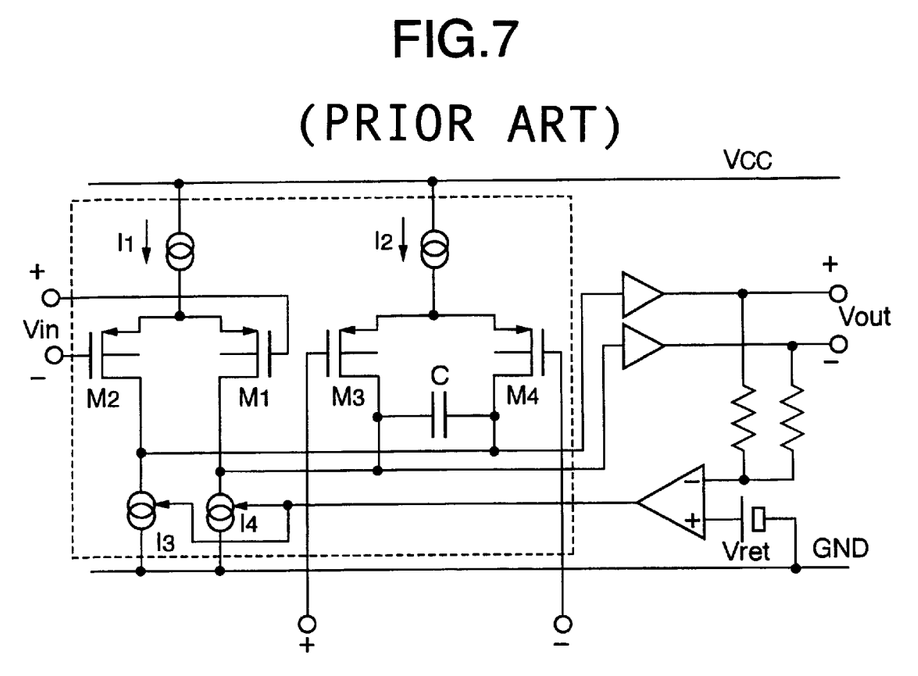
FIG. 7 is a diagram depicting a circuit explaining the configuration of the fully differential filter in FIG. 6.

FIG. 7 shows a concrete example of integrators in the stages forming the filter in FIG. 6 realized using CMOS circuitry. A pair of source-coupled differential transconductors are used to produce transconductance. The differential circuit comprising M1, M2 and I1 corresponds to transconductor Gm1+ or Gm2+; the differential circuit comprising M3, M4 and I2 corresponds to transconductor Gm1- or Gm2-. The current outputs are summed at the output point. Output is differentially extracted by biasing with two current supplies I3, I4 which join at GND. With respect to differential input bias currents I1 and I2, these current supplies I3, I4 must be precisely (I1+I2)/2 respectively. If this relationship is evenly slightly disrupted, since the DC impedance of the output terminal of each stage is extremely high, the unbalance between the upper and lower current supplies causes the output DC voltage to be greatly disrupted, leading to instability.

"DC feedback" is a circuit designed to counter this problem, ensuring stability by fixing output DC potential at a certain voltage. One of the resistor terminals is connected to the output terminal in FIG. 7. The other resistor terminal is now connected to each other, and is compared by the operational amplifier with the intended voltage Vref. When all output signals are fully differential and the two resistors are equal values, the DC potential of the output signal can be extracted from the center point and compared with Vref. When the DC potential is higher than Vref, the current from the current supply is increased and the common-mode voltage of the output is lowered. Conversely, when the DC potential is lower than Vref, the current from the current supply is decreased, raising the common-mode voltage of the output.

Thus current is controlled so that the common-mode voltage of the output signal equals Vref. The circuit is biased so that the DC voltages of differential outputs in each stage of the filter equal Vref, but the number of circuit elements is likely to be increased. Not only does the operational amplifier itself require a considerable number of elements, but a buffer circuit and such like must be provided as shown in the diagram in order to prevent the resistors which detect center point voltage from influencing the high-impedance integrator output terminals. Moreover, a DC feedback circuit is required for each integrator, thereby taking up a large portion of the overall area of the filter.

In the circuit shown in FIG. 7, for instance, the essential portion of the integrator within the dotted line on the left side comprises 4 MOS transistors, 4 current supplies and 1 capacitor, thus requiring approximately 10~15 elements. By contrast, a DC feedback circuit for setting bias has as many as 20~30 elements, thereby taking up two thirds of the area. Since the filter is formed simply by assembling these elements, it follows that the DC feedback circuit takes up roughly two thirds of the total filter area. This need for a DC feedback has resulted in increased costs for fully differential filters and has been an obstacle for producing an inexpensive filter.

SUMMARY OF THE INVENTION

An object of the present invention is to provide a fully differential filter circuit which does not require DC feedback circuit.

One aspect of the present invention is to provide a filter circuit comprising a first circuit block, having a first differential-mode voltage input and a differential-mode current output, and a common-mode voltage of the first differential-mode voltage input being inverted at the output, and a second circuit block, having a second differential-mode voltage input and a differential-mode voltage output, and a common voltage of the second differential voltage input being inverted at the output, wherein the first and second circuit blocks form one of constituent elements on a recursive feedback pass, wherein a total number of the constituent elements formed with the first and second circuit blocks is odd including one and wherein a capacitor is connected to the differential-mode current output.

In the filter circuit, a plurality of at least the transconductor and the capacitor and the current supply are used and a given combination of these is mutually connected. The constituent element is not limited to the first circuit block and the second circuit block. Typically, the transconductor is referred to as Operational Transconductance Amplifier (OTA). In the specification, the term "input" means "a pair of input terminals" and the term "output" means "a pair of output terminals."

According to the first aspect of the filter circuit, the first circuit block is a transconductor which has a certain transconductance for the first differential-mode voltage input and has high negative gain for the common-mode voltage of the first differential-mode voltage input, and the second circuit block is an amplifier which has a predetermined gain for the second differential-mode voltage input and has a negative gain comparable to predetermined gain for the common-mode voltage of the second differential-mode voltage input.

Further according to the above filter circuit, the transconductor has a pair of first field effect transistors, connects a pair of sources of the first transistors to a common fixed-voltage terminal; a pair of gates of the first transistors are used as input terminals of the transconductor; a pair of drains of the first transistors are connected to a current source and are used as output terminals; and the amplifier has two pair of second field effect transistors having a pair of input side second transistors and a pair of output side second transistors; a pair of sources of the input side second transistors are connected to the common fixed-voltage terminal; a pair of gate of the input side second transistors are used as input terminals; a pair of drains of the input side second transistors are respectively connected to a pair of sources of the output side second transistors; a pair of gates and a pair of drains of the output side second transistors are connected to at least one common fixed voltage terminal.

Still further according to the above filter circuit, a filter frequency characteristic is proportionally adjusted by controlling all of the current sources with their mutual current ratio being constant.

Second aspect of the present invention is to provide a filter circuit comprising a transconductor, having a first differential-mode voltage input and a differential-mode current output, having a certain transconductance for the first differential-mode voltage input and having a high negative gain for a common-mode voltage of the first differential-mode voltage input, an amplifier, having a second differential-mode voltage input and a differential-mode voltage output, having a predetermined gain for the second differential-mode voltage input, and having a negative gain comparable to the predetermined gain for the common-mode voltage of the second differential-mode voltage input, a current source connected to the first differential-mode voltage output of the transconductor, and a capacitor connected to the first different-mode voltage output of the transconductor, wherein the transconductor and the amplifier forms a recursive feedback pass that makes a round of a pair of nodes, input and output terminals of the transconductor or the amplifier and the pair of nodes, and wherein a total number of the transconductor and the amplifier which pass through the feedback loop is odd including one.

According to the second aspect of the filter circuit, one transconductor and even number of the amplifiers exist in the recursive feedback pass.

Further according to the second aspect of the filter circuit, two transconductors and odd number of the amplifiers exist in the recursive feedback pass.

Alternatively, three capacitors may be connected to the two transconductors; one of the three capacitors may be connected to the differential-mode current output of one of the transconductors and two of the three capacitors may be connected between the fixed voltage terminal and the differential-mode current output of the transconductors.

Third aspect of the present invention is to provide a filter circuit comprising first, second, third and fourth transconductors, each having a differential-mode voltage input and a differential-mode current output, each having a certain transconductance for the differential-mode voltage input and each having a high negative gain for a common-mode voltage of the differential-mode voltage input, and an amplifier, having a differential-mode voltage input and a differential-mode voltage output, having a predetermined gain for the differential-mode voltage input and having a negative gain comparable to the predetermined gain for the common-mode voltage of the differential-mode voltage input, wherein the differential-mode current output of the first transconductor is connected to the differential-mode current output of the second transconductor via a first pair of nodes; the nodes are connected the differential-mode voltage input of the amplifier, and each node is connected to a capacitor and a current source, wherein the differential-mode current output of the third transconductor is connected to the differential-mode current output of the fourth transconductor via a second pair of nodes; each node is connected to a capacitor and a current source, and the nodes are connected to the differential-mode voltage inputs of the second and the fourth transconductors with being inverted the differential-mode current outputs of the third and the fourth transconductors, wherein the differential-mode voltage output of the amplifier is connected to the differential-mode voltage input of the third transconductor, and wherein the differential-mode voltage input of the first transconductor is used as a filter input.

Alternatively, the differential-mode voltage input of the amplifier may be connected to the differential-mode voltage input of the fourth transconductor, the differential-mode voltage output of the amplifier may be connected to the differential-mode input voltage of the second transconductor, and the differential-mode current output of the first transconductor may be connected to the differential-mode input voltage of the third transconductor.

Fourth aspect of the present invention is to provide a filter circuit comprising first, second and third transconductors, each having a differential-mode voltage input and a differential-mode current output, each having a certain transconductance for the differential-mode voltage input and each having a high negative gain for a common-mode voltage of the differential-mode voltage input, and an amplifier, having a differential-mode voltage input and a differential-mode voltage output, having a predetermined gain for the differential-mode voltage input and having a negative gain comparable to the certain gain for the common-mode voltage of the differential-mode voltage input, wherein the differential-mode current output of the first transconductor is connected to a pair of capacitors and a first pair of current sources via a first pair of nodes, the nodes are connected to the differential-mode voltage input of the amplifier, wherein the differential-mode current output of the second transconductor is connected to the differential-mode current output of the third transconductor via a second pair of nodes; the nodes are connected to the differential-mode voltage inputs of the first and the third transconductors with being inverted the differential-mode current outputs of the second and third transconductors, a capacitor is connected between the second pair of nodes, and a second pair of current sources is connected to the nodes, wherein the differential-mode voltage output of the amplifier is connected to the differential-mode voltage input of the second transconductor, and wherein the pair of capacitors is used as a filter input.

Alternatively, the differential-mode voltage input of the amplifier may be connected to the differential-mode voltage input of the third transconductor, the differential-mode voltage output of the amplifier may be connected to the differential-mode voltage input of the first transconductor, and the differential-mode current output of the first transconductor may be connected to the differential-mode voltage input of the second transconductor.

Fifth aspect of the present invention is to provide a filter circuit comprising first, second and third transconductors, each having a differential-mode voltage input and a differential-mode current output, each having a certain transconductance for the differential-mode voltage input and each having a high negative gain for a common-mode voltage of the differential-mode voltage input, and an amplifier, having a differential-mode voltage input and a differential-mode voltage output, having a predetermined gain for the differential-mode voltage input and having a negative gain comparable to the predetermined gain for the common-mode voltage of the differential-mode voltage input, wherein the differential-mode current output of the first transconductor is connected to a capacitor and a first pair of current sources via a first pair of nodes, the nodes are connected to the differential-mode voltage input of the amplifier, wherein the differential-mode current output of the second transconductor is connected to the differential-mode current output of the third transconductor via a second pair of nodes; the nodes are connected to the differential-mode voltage inputs of the first and the third transconductors with being inverted the differential-mode current outputs of the second and third transconductors, a pair of capacitor and a second pair of current sources is connected to the nodes, wherein the differential-mode voltage output of the amplifier is connected to the differential-mode voltage input of the second transconductor, and wherein the pair of capacitors is used as a filter input.

Alternatively, the differential-mode voltage input of the amplifier may be connected to the differential-mode voltage input of the third transconductor, the differential-mode voltage output of the amplifier may be connected to the differential-mode voltage input of the first transconductor, and the differential-mode current output of the first transconductor may be connected to the differential-mode voltage input of the second transconductor.

Sixth aspect of the present invention is to provide a high-order filter circuit comprising a combination of the above-described filter circuits.

DESCRIPTION OF THE PREFERRED EMBODIMENTS

The preferred embodiments of the present invention will next be explained with reference to the diagrams.

Figure 1:
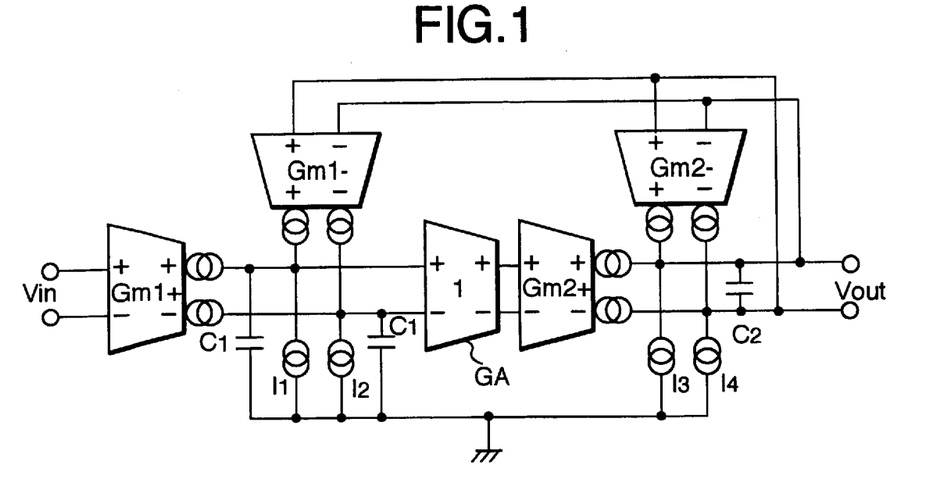
FIG. 1 is a diagram depicting a circuit configuration explaining a first embodiment of the present invention.

FIG. 1 shows a circuit configuration explaining a first embodiment of the present invention. In the first embodiment, a low-pass filter (LPF) consists of two pairs of transconductors Gm1+ (first), Gm1− (second) and Gm2+ (third), Gm2− (fourth), a gain amplifier GA and integrating capacitors.

Input Vin connects to the positive and negative inputs of transconductor Gm1+. Positive output of transconductor Gm1+ connects to the positive output of transconductor Gm1− and the positive input of fixed gain amplifier GA which has a gain coefficient K of 1 and connects to the reference potential node via integrator capacitor C1 and current supply I1 which are connected in parallel. The negative output of transconductor Gm1+ connects to the negative output of transconductor Gm1− and the negative input of fixed gain amplifier GA and connects to the reference potential node via integrator capacitor C1 and current supply I2 which are connected in parallel. Positive output of fixed gain amplifier GA connects to the positive input of transconductor Gm2+. The negative output of fixed gain amplifier GA connects to the negative input of transconductor Gm2+. Positive output of transconductor Gm2+ connects to the positive output of transconductor Gm2− and connects to the reference potential node via current supply I3. Negative output of transconductor Gm2+ connects to the negative output of transconductor Gm2− and connects to the reference potential node via current supply I4. Positive and negative outputs of transconductor Gm2+ connect to both terminals of integrator capacitor C2 and to output Vout. The positive output of transconductor Gm2+ connects to the negative inputs of both transconductors Gm1− and Gm2−. The negative output of transconductor Gm2+ connects to the positive inputs of both transconductors Gm1− and Gm2−.

The positive and negative inputs of the transconductors refer to the differential-mode voltage input, and the positive and negative outputs of the transconductors refer to the differential-mode current output. The positive and negative inputs of the amplifier refer to the differential-mode voltage input, and the positive and negative outputs refer to the differential-mode voltage output.

The features of this configuration are firstly that the circuit is a fully differential one, in which all inputs and outputs of transconductors Gm1+, Gm1−, Gm2+ and Gm2− and fixed gain amplifier GA are fully differential signals, and secondly that the number of these constituent elements on the recursive feedback pass is 3. The number of elements is increased to an odd number by inserting a fixed gain amplifier GA with a gain of 1 which does not usually feature in conventional filter topology.

Consequently, since each element of the circuit inverts the common-mode voltage as explained below, this recursive feedback pass has negative feedback for the common-mode voltage; the operating point can therefore be determined without the need for a dedicated DC feedback (common mode feedback) circuit.

Each stage consists of two transconductors and an integrating capacitor connected to the output terminals thereof. Transconductors Gm1+ and Gm2+ correspond to + input in a single configuration; transconductors Gm1− and Gm2− correspond to − input (feedback input) in a single configuration. The transconductance value gm of each transconductor is as follows:

Gm1+, Gm1−: gm1
Gm2+, Gm2−: gm2

The transmission coefficient between input and output in the circuit is determined by:

$$\frac{Vo}{Vi} = \frac{(gm1gm2)/(C1C2)}{S + \{(gm2)/(C2)\}S + (gm1gm2)/(C1C2)}$$

As is clear from this equation, the circuit of the present embodiment exhibits a second-order LPF effect since the zero point of the transmission coefficient exists in duplicate at infinite frequency.

Figure 2:
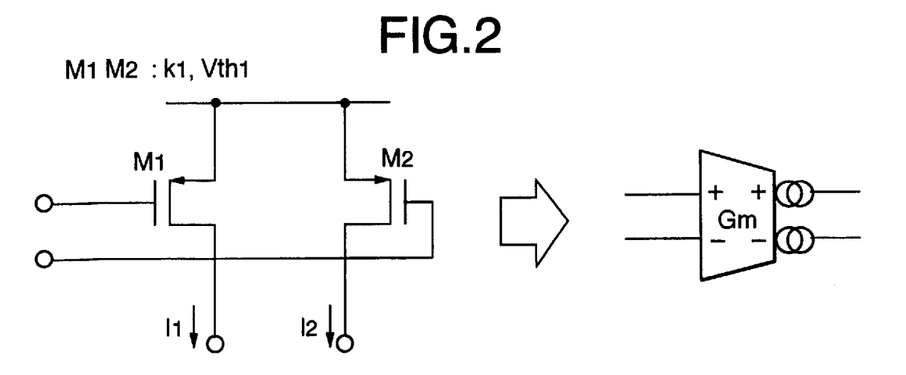
FIG. 2 is a diagram depicting a transconductor used in a filter circuit of the present invention.

Each of the transconductors Gm1+, Gm1−, Gm2+ and Gm2− in FIG. 1 has the configuration shown in FIG. 2. In other words, each transconductor Gm1+, Gm1−, Gm2+ and Gm2− comprises source-coupled differential MOS transistors M1 and M2 whose source is directly connected to power the supply, and inputs a differential signal of the previous stage to a gate. The drain terminals of these two transconductors are connected to each other with the same polarity and integrating capacitors are connected to the positive and negative output terminals which then function as differential output terminals. Both these terminals are biased by the current supply.

In order to investigate the operation of this circuit, the voltage-to-current conversion properties of differential MOS transistors M1 and M2 are measured. It is assumed here that all input signals are fully differential signals, and it is presumed that both transistors have identical properties and are biased in the saturation mode region. Ignoring output resistance and substrate body effects, the drain current of the two transistors can be defined as follows:

M1: $I1 = (k1/2)(VGS1 - Vth1)^2$ (1)

M2: $I2 = (k1/2)(VGS2 - Vth1)^2$ (2)

In the above, $k = \mu CoxW/L = \mu(\epsilon ox/tox)\ W/L$, $\mu$=electron mobility of the device, $\epsilon ox$=permittivity of the gate oxide film, tox=gate oxide film thickness, wafer W is gate width, L is gate length.

When output is the difference in the drain currents of differential MOS transistors M1 and M2, based on (1) and (2), output I1−I2 can be determined by:

$$I1 - I2 = (k1/2)(VGS1 + VGS2 - 2Vth1)(VGS1 - VGS2)$$
$$= (k1/2)(VGS1 + VGS2 - 2Vth1)Vin$$

When Vb denotes input signal DC voltage corresponding to the power supply voltage, the input signal is fully differential, and since the source terminals of differential MOS transistors M1 and M2 are fixedly connected to the power supply, VGS1+ VGS2=2Vb. Therefore:

$I1-I2=k1\ (VB-Vth1)\ Vin$ (3)

Thus transconductance Gm from differential-mode input voltage to differential-mode output voltage can be defined as:

$$Gm = Iout/Vin = (I1 - I2)/Vin \quad (4)$$
$$= K1(VB - Vth1)$$

Equation (4) has no term dependent on input signal Vin nor term "$Vin^2$" which can cause second-order distortion. If the pair elements are matched completely (M1=M2), Gm is ideally determined by the W/L ratio of the elements. Therefore, as long as output is extracted differentially, transconductance is fixed and is not dependent on input. Furthermore, deviations in Vth1 can be adjusted by controlling the input bias voltage Vb. Moreover, equation (4) shows that the Gm value can be actively controlled in accordance with Vb.

A transconductor as above which is source-grounded and fully differential solves the problem of second-order distortion liable to occur with a CMOS analog circuit and produces highly linear transconductance. Furthermore, since current supply need not be placed at the differential source connection point, it is possible to used only the voltage portion of the current supply as power voltage, thereby giving the advantage of voltage reduction.

FIG. 2 shows an example in which PMOS was used in a differential transistor, but exactly the same integrator circuit can be formed when NMOS is used in a differential transistor with the power and the GND reversed, and the same effects can be obtained.

Figure 3:
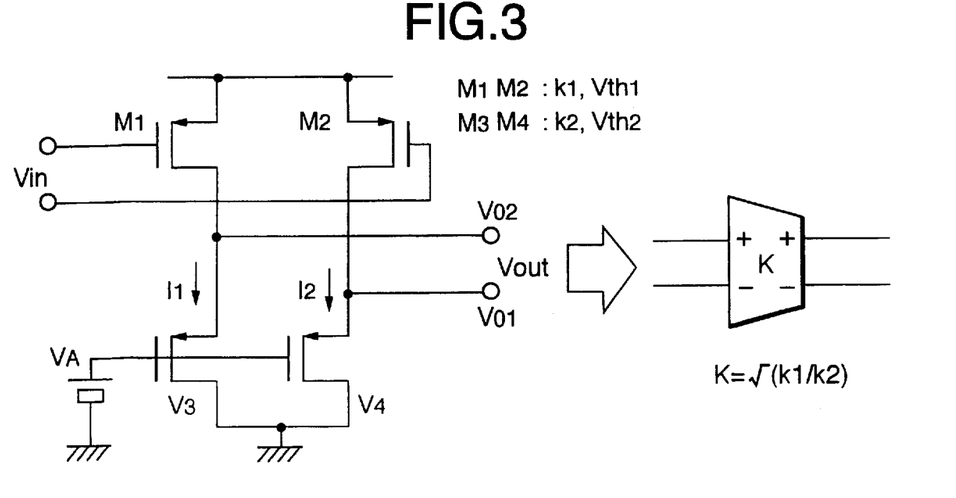
FIG. 3 is a diagram depicting a fixed gain amplifier used in a filter circuit of the present invention.

FIG. 3 shows an actual circuit in which the fixed gain amplifier GA in FIG. 1 is set at K=1. In other words, MOS transistors M3 and M4 are provided as loads for differential MOS transistors M1 and M2 which are the same transistor pair as the transconductor of FIG. 2. The previous stage differential signal is input to gates of MOS transistors M1 and M2. Here, when voltage-to-current conversion properties of differential MOS transistors M1 and M2 are measured under the same conditions as in the calculation above, both M1 and M2 were found to have the same operating properties as was determined in equations (1) and (2) respectively. Similarly, operating properties (drain voltages) of M3 and M4 can be defined by the following equations:

$$M3: I1=(k2/2)(VGS3-Vth2)^2 \quad (5)$$

$$M4: I2=(k2/2)(VGS4-Vth2)^2 \quad (6)$$

By solving equations (1), (2), (5) and (6) simultaneously, the gain from differential-mode input voltage to differential-mode output voltage can be determined by:

$$Vout/Vin = (VGS3-VGS4)/(VGS1-VGS2) \quad (7)$$

$$= /\sqrt{(k1/k2)}$$

Equation (7) shows that when the pair of elements are perfectly matched (M1=M2, M3=M4), gain can ideally be determined simply from the geometric factor W/L of the elements; in principle, differential signals produce an amplifier having fixed gain with no distortion. Alternatively, for common signals, the amplifier is source-ground and has gain roughly equal to the gain for a differential signal but is phase-inverted. For differential signals, connection to the next stage determines a phase polarity of the amplifier to output negative-phase, but for a common signal, the amplifier is always phase inverted. In the circuit shown in FIG. 1, a common signal is inverted after this amplifier.

The source of the transconductor shown in FIG. 2 is directly grounded. Since the source is not connected to the current supply for biasing, the common-mode voltage of an input signal cannot be removed. In fact, utilizing this feature eliminates the need for a dedicated DC feedback circuit as shown in the filter circuit in FIG. 1.

A differential circuit comprising MOS transistors M1 and M2 has high gain between input and output with respect to common-mode voltages because the sources of M1 and M2 are fixed by the power supply. In other words, if input gate voltages both increase, output drain voltages will greatly decrease. Conversely, if input gate voltages both decrease, output drain voltages greatly increase. Moreover, the fixed gain amplifier shown in FIG. 3 has inverse gain with respect to common-mode voltages as already explained.

The transmission of common voltages in the FIG. 1 circuit is measured. This circuit has a recursive feedback pass returning along the path: Gm2+~Gm1-~1 ~Gm2+. When we consider the transmission of common-mode voltages along this loop it is clear that, since each constituent of the configuration inverts a total of three times before returning, the loop has negative feedback. In other words, the output voltage of each constituent of the configuration stabilizes to a voltage determined according to the current value of the bias current supply on the GND side. For instance, when the shapes of the MOS transistors forming each transconductor are all equal and the GND side bias current values biasing the transconductor are all equal, the output voltages of each stage will all be equal. I1 and I2 have half the current value of each current supply, these voltages are equal to the VGS value determined by entering these current values into equations (1) and (2). However, this convergence voltage must be predicted beforehand and a common voltage close to that convergence voltage must be given as input Vin.

Since each field effect transistor self-biases to a current value determined with the drain side current supply, there is no need to provide a dedicated DC feedback circuit.

Therefore, the number of elements in the filter circuit of the present embodiment can be greatly reduced to obtain a low-cost CMOS filter. The above example described a filter circuit consisting of two stages, but by adjusting the number of fixed gain amplifiers on the recursive feedback pass, common voltage-mode transmission with negative feedback can be realized in a filter circuit with an increased number of stages.

Therefore, by combining the transconductor shown in FIG. 2 with the fixed gain amplifier in FIG. 3, a low-cost, small-scale filter having given properties can be produced with no need for a dedicated DC feedback circuit.

This type of common recursive feedback pass is susceptible to voltage oscillation. Since the "Gm2+~Gm1-~1 ~Gm2+" loop in FIG. 1 has two high-gain stages Gm2+ and Gm1-, phase compensation is essential to prevent oscillation resulting from high-frequency phase delay. In FIG. 1, this is achieved by dividing Gm1 output terminal capacitor C1 into 2 portions and connecting each portion to a corresponding GND. In this way, while 2C1 has a capacitive load with respect to common-mode voltage at the output terminal of transconductor Gm1, there is no capacitive load with respect to common-mode voltage at the output terminal of transconductor Gm2.

Therefore, phase compensation in which Gm1 and 2C1 are used to create 1 low-frequency pole can be provided to the common recursive feedback pass. Since the capacitor defines filter characteristics and also provides phase compensation for the common recursive feedback pass, this method has the advantage of being highly economical.

Furthermore, when the current values of all current supplies which bias the output terminal of each stage are proportioned, the VGS of the MOS transistors forming each transconductor are changed at the same time. This signifies a change in VB in equation (4) and enables the Gm of each transconductor to be proportionally controlled as explained above. As a consequence, filter characteristics can be shifted on the frequency axis, which is particularly effective for adjusting time constant variation caused by variation in IC manufacturing processes.

Figure 4:
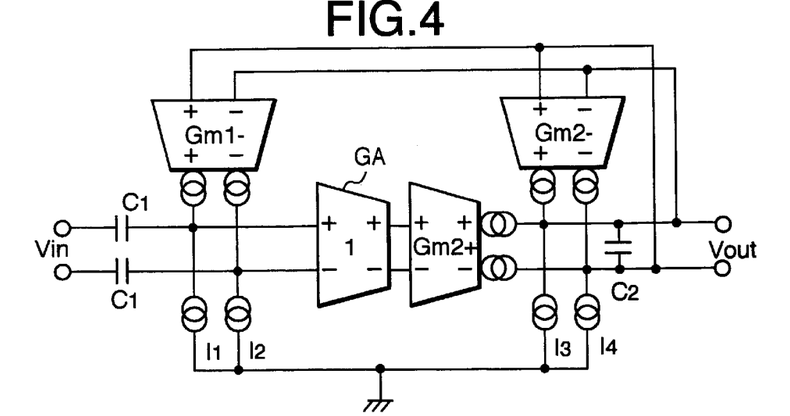
FIG. 4 is a diagram depicting a circuit configuration explaining a second embodiment of the present invention.

Next, a second embodiment of the present invention will next be explained with reference to the circuit configuration shown in FIG. 4. The second embodiment differs form the first depicted in FIG. 1 in that transconductor Gm1+ is removed, capacitors C1 and C2, which were connected to the reference voltage point, are now connected to input Vin, and transconductors Gm1- (first), Gm2+ (second) and Gm2- (third) are remained.

In this case, it can be easily surmised that there is no DC transmission from input to output and the filter becomes a band-pass filter (BPF). As in the first embodiment, since the common transmission loop is exactly the same as that in FIG. 1, stable self-bias is similarly produced by means of a common-mode voltage recursive feedback pass and there is no need for a dedicated DC feedback circuit. However, in the second embodiment, in comparison with FIG. 1, current supplies I1 and I2 for the portion from which transconductor Gm1+ has been removed may acceptably have low current values.

Figure 5:
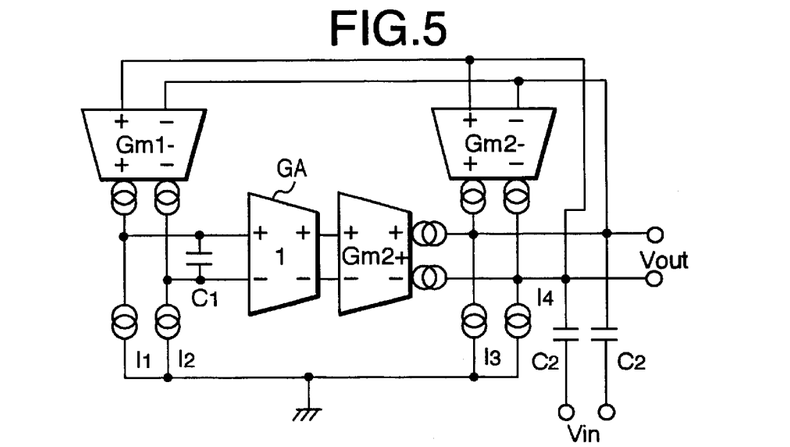
FIG. 5 is a diagram depicting a circuit configuration explaining a third embodiment of the present invention.

FIG. 5 shows a circuit configuration of a third embodiment of the present invention. The third embodiment differs from the embodiment shown in FIG. 4 in that input is connected to output Vout via capacitors C2 and C2 and both terminals of capacitor C1 are connected between the input terminals of fixed gain amplifier GA. Transconductors Gm−1 (first), Gm2+ (second) and Gm2− (third) are remained.

When a signal is input in this configuration, since the zero point of the transmission coefficient exists in duplicate at zero frequency, the circuit exhibits the effects of a high-pass filter (HPF). Since the common transmission loop is exactly the same as that in FIG. 4, stable self-bias is similarly produced by means of a common-mode voltage recursive feedback pass and there is no need for a dedicated DC feedback circuit.

According to the present invention as described in embodiments 1–3, it is possible to create a given high-order filter circuit by cascade-connecting the main properties of three types of filter circuits or alternative types of the filter circuits according to the present invention. This further utilizes the advantage of the small-scale and low-cost filter provided by the present invention.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A filter circuit comprising:
   at least two first type constituent elements having two input ends and two output ends respectively, wherein a difference voltage of the two input ends is converted to a difference current and provided at the two output ends, and a mean voltage of the two input ends is converted to a mean voltage having a high inversion gain and provided at the two output ends respectively;
   first and second current sources respectively connected to the output ends of the first type constituent elements;
   first and second capacitors respectively connected to the first and second current sources and respectively connected to the output ends of the first type constituent elements;
   a second type constituent element having two input ends and two output ends, wherein a difference voltage of the two input ends is converted to a difference voltage and provided at the two output ends and a mean voltage of the two input ends is converted to a negative mean voltage and provided at the two output ends;
   wherein the output ends of one of the first type constituent elements are electrically coupled to respective input ends of the second type constituent element;
   wherein the output ends of the second type constituent element are electrically coupled to respective input ends of the other first type constituent element;
   circuit input terminals coupled to the input ends of at least one of the first and second type constituent elements; and
   circuit output terminals coupled to the output ends of at least one of the first type constituent elements;
   wherein the electrically coupled first and second type constituent elements define a signal flow loop, the loop including one of the second type constituent elements and an even number of the first type constituent elements.

2. A filter circuit comprising:
   a transconductor including a pair of first field effect transistors, sources of the first transistors being connected to a common fixed-voltage terminal, gates of the first transistors defining a pair of input transconductor terminals, and drains of the first transistors being connected to current sources and defining a pair of output transconductor terminals;
   a pair of capacitors connected to the pair of output transconductor terminals, one capacitor being connected to each output transconductor terminal;
   an amplifier electrically coupled to the transconductor and including a pair of input side transistors and a pair of second field effect transistors forming an output side, the input side transistors being the same type transistors as the first field effect transistors of the transconductor;
   wherein gates and drains of the input side transconductor respectively define amplifier input and output terminals, and gates and drains of the output side transistors are connected to at least one common fixed voltage terminal respectively;
   a circuit input terminal coupled to one of the pairs of input transconductor terminals and the amplifier input terminals; and
   a circuit output terminal coupled to the pair of output transconductor terminals;
   wherein the electrically coupled transconductor and amplifier are one of a plurality of constituent elements respectively, the constituent elements forming a recursive feedback path, the plurality of constituent elements forming the recursive feedback path being an odd number of constituent elements.

3. A filter circuit according to claim 1, wherein a frequency characteristic of the filter is proportionally adjusted by controlling the current sources in such a way that a current ratio associated with the first and second transistors remains constant.

4. A filter circuit comprising:
   a transconductor (i) having a pair of input terminals and a pair of output terminals, (ii) producing a predetermined transconductance in response to a differential-mode input voltage and (iii) producing a high inversion gain in response to a common-mode input voltage;
   an amplifier electrically coupled to the transconductor and having a pair of input terminals and a pair of output terminals, the amplifier producing a predetermined gain in response to a differential-mode input voltage, and producing an inversion gain comparable to a differential gain in response to a common-mode input voltage;
   a current source connected to each output terminal of the transconductor;
   a capacitor connected to each output terminal of the transconductor, the capacitor being connected in parallel with the current source;
   a circuit input terminal coupled the input terminals of one of the transconductor and the amplifier; and
   a circuit output terminal coupled to the output terminals of the transconductor,
   wherein the transconductor and the amplifier are one of a plurality of constituent elements respectively, the constituent elements forming a recursive feedback path, the recursive feedback path including an odd number of the constituent elements.

5. A filter circuit according to claim 4, wherein the recursive feedback path includes an even number of the transconductors and one amplifier.

6. A filter circuit according to claim 4, wherein the recursive feedback path includes two of the transconductors and odd number of the amplifiers.

7. A filter circuit according to claim 6, wherein the two transconductors are connected to three capacitors, one of the three capacitors being connected across the output terminals of one of the transconductors and the other two of the three capacitors being connected between fixed voltage terminals and the output terminals of the other transconductor.

8. A filter circuit comprising:

first, second, third, and fourth transconductors, each respectively comprising a pair of first field effect transistors, sources of the first field effect transistors being connected to a common fixed-voltage terminal, gates of the first field effect transistors defining a pair of input terminals, drains of the first field effect transistors being connected to current sources and defining a pair of output terminals; and an amplifier having a pair of input terminals and a pair of output terminals, the amplifier comprising a pair of input side transistors and a pair of second field effect transistors forming an output side, the input side transistors being the same type transistors as the first field effect transistors, gates and drains of the second field effect transistors being connected to at least one common fixed voltage terminal respectively;

wherein the pair of output terminals of the first transconductor is connected to the pair of output terminals of the second transconductor via a first pair of nodes, the nodes being connected to the pair of input terminals of the amplifier, and each node of the pair of nodes being connected to a first capacitor and a first current source;

wherein the pair of output terminals of the third transconductor is connected to the pair of output terminals of the fourth transconductor via a second pair of nodes, each node of the second pair of nodes being connected to a second capacitor and a second current source, and the second pair of nodes also being connected to the pair of input terminals of the second and the fourth transconductors in a cross-coupled configuration, a positive output terminal of the third and the fourth transconductor being connected to a negative input terminal of the second and the fourth transconductors, and a negative output terminal of the third and fourth transconductors being connected to a positive input terminal of the second and the fourth transconductors;

wherein the pair of output terminals of the amplifier is connected to the pair of input terminals of the third transconductor; and wherein the pair of input terminals of the first transconductor is used as a filter input terminal, and the pair of output terminals of the third transconductor is used as a filter output terminal.

9. A filter circuit according to claim 8, wherein a difference voltage of the pair of input terminals of the transconductors is converted to a difference current and provided at the pair of output terminals thereof and a mean voltage of the pair of input terminals of the transconductors is converted to a mean voltage having a negative high gain and provided at the pair of output terminals thereof; and wherein a difference voltage of the pair of input terminals of the amplifier is converted to a difference voltage and provided at the output terminals thereof and a mean voltage of the pair of input terminals of the amplifier is converted to a negative mean voltage and provided at the pair of output terminals thereof.

10. A filter circuit according to claim 8, wherein the first, second, third and fourth transconductors have (i) a predetermined transconductance for a differential-mode input voltage and (ii) a high inversion gain for a common-mode input voltage; and wherein the amplifier has a predetermined gain for a differential mode input voltage and has an inversion gain comparable to the predetermined gain for a common-mode input voltage.

11. A filter circuit comprising:

first, second, and third transconductors, each respectively comprising a pair of first field effect transistors, sources of the first field effect transistors being connected to a common fixed-voltage terminal, gates of the first field effect transistors defining a pair of input terminals, drains of the first field effect transistors being connected to current sources and defining a pair of output terminals; and an amplifier having a pair of input terminals and a pair of output terminals, the amplifier comprising a pair of input side transistors and a pair of second field effect transistors forming an output side, the input side transistors being the same type transistors as the first field effect transistors, gates and drains of the second field effect transistors being connected to at least one common fixed voltage terminal respectively;

wherein the pair of output terminals of the first transconductor in connected to a pair of capacitors and a pair of current sources via a first pair of nodes, the nodes being connected to the pair of input terminals of the amplifier;

wherein the pair of output terminals of the second transconductor is connected to the pair of output terminals of the third transconductor via a second pair of nodes, each node of the second pair of nodes being connected to a capacitor and a current source and connected to the pair of input terminals of the first and third transconductors in a cross-coupled configuration, a positive output terminal of the second and the third transconductors being connected to a negative input terminal of the first and third transconductors, and a negative output terminal of the second and the third transconductor being connected to the positive input terminal of the first and the third transconductors;

wherein the pair of output terminals of the amplifier is connected to the pair of input terminals of the second transconductor; and wherein the pair of capacitors is used as a filter input terminals, and the pair of output terminal of the second transconductor are used as filter output terminals.

12. A filter circuit according to claim 11, wherein a difference voltage of the pair of input terminals of the transconductors is converted to a difference current and provided at the pair of output terminals thereof and a mean voltage of the pair of input terminals of the transconductors is converted to a mean voltage having a negative high gain and provided at the pair of output terminals thereof; and wherein a difference voltage of the pair of input terminals of the amplifier is converted to a difference voltage and provided at the output terminals thereof and a mean voltage of the pair of input terminals of the amplifier is converted to a negative mean voltage and provided at the pair of output terminals thereof.

13. A filter circuit according to claim 11, wherein the first, second, and third transconductors have (i) a predetermined transconductance for a differential-mode input voltage and (ii) a high inversion gain for a common-mode input voltage; and wherein the amplifier has a predetermined gain for a differential-mode input voltage and has an inversion gain comparable to the predetermined gain for a common-mode input voltage.

14. A filter circuit comprising:

first, second, and third transconductors, each respectively comprising a pair of first field effect transistors, sources of the first field effect transistors being connected to a common fixed-voltage terminal, gates of the first field effect transistors defining a pair of input terminals, drains of the first field effect transistors being connected to current sources and defining a pair of output terminals; and an amplifier having a pair of input terminals and a pair of output terminals, the amplifier comprising a pair of input side transistors and a pair of second field effect transistors forming an output side, the input side transistors being the same type transistors as the first field effect transistors of the transconductor, gates and drains of the second field effect transistors being connected to at least one common fixed voltage terminal respectively;

wherein the pair of output terminals of the first transconductor is connected to a capacitor and a first pair of current sources via a first pair of nodes, the nodes being connected to the pair of input terminals of the amplifier;

wherein the pair of output terminals of the second transconductor is connected to the pair of output terminals of the third transconductor via a second pair of nodes, each node of the second pair of nodes being connected to a pair of capacitors and a second pair of current sources and the second pair of nodes being connected to the pair of input terminals of the first and the third transconductors in a cross-coupled configuration, a positive output terminal of the second and the third transconductors being connected to a negative input terminal of the first and the third transconductors and a negative output terminal of the second and the third transconductors being connected to a positive input terminal of the first and the third transconductors;

wherein the pair of output terminals of the amplifier is connected to the pair of input terminals of the second transconductor; and wherein the pair of capacitors is used as a filter input terminal, and the pair of output terminals of the second transconductor is used as a filter output terminal.

15. A filter circuit according to claim 14, wherein a difference voltage of the pair of input terminals of the transconductors is converted to a difference current and provided at the pair of output terminals thereof and a mean voltage of the pair of input terminals of the transconductors is converted to a mean voltage having a negative high gain and provided at the pair of output terminals thereof; and wherein a difference voltage of the pair of input terminals of the amplifier is converted to a difference voltage and provided at the output terminals thereof and a mean voltage of the pair of input terminals of the amplifier is converted to a negative mean voltage and provided at the pair of output terminals thereof.

16. A filter circuit according to claim 14, wherein the first, second, and third transconductors have (i) a predetermined transconductance for a differential-mode input voltage and (ii) a high inversion gain for a common-mode input voltage; and wherein the amplifier has a predetermined gain for a differential-mode input voltage and has an inversion gain comparable to the predetermined gain for a common-mode input voltage.

* * * * *